United States Patent
Lin et al.

(10) Patent No.: US 8,325,794 B2
(45) Date of Patent: Dec. 4, 2012

(54) APPARATUS AND METHOD FOR CALIBRATING IQ MISMATCH

(75) Inventors: Ying-Yao Lin, Chubei (TW); Fong-Ching Huang, Hsin-Chu (TW)

(73) Assignee: Realtek Semiconductor Corp., Hsinchu (TW)

(*) Notice: Subject to any disclaimer, the term of this patent is extended or adjusted under 35 U.S.C. 154(b) by 1578 days.

(21) Appl. No.: 11/532,101

(22) Filed: Sep. 15, 2006

(65) Prior Publication Data

US 2007/0058754 A1    Mar. 15, 2007

(30) Foreign Application Priority Data

Sep. 15, 2005   (TW) ................................ 94131911 A

(51) Int. Cl.
*H03H 7/30*       (2006.01)
*H03H 7/40*       (2006.01)
*H03K 5/159*     (2006.01)

(52) U.S. Cl. ........ 375/235; 370/206; 370/329; 370/203; 455/226.1; 455/205; 455/501; 375/343; 375/340; 375/344; 375/346

(58) Field of Classification Search .......................... None
See application file for complete search history.

(56) References Cited

U.S. PATENT DOCUMENTS

| | | | | |
|---|---|---|---|---|
| 5,150,128 A * | 9/1992 | Kongelbeck | .................. | 342/174 |
| 5,808,512 A * | 9/1998 | Bainvoll et al. | ............... | 330/151 |
| 5,822,366 A * | 10/1998 | Rapeli | ........................... | 375/219 |
| 6,304,751 B1 * | 10/2001 | King | ............................. | 455/306 |
| 6,385,442 B1 * | 5/2002 | Vu et al. | ........................ | 455/318 |
| 6,661,292 B2 * | 12/2003 | Gierl et al. | .................... | 331/1 A |
| 7,132,872 B2 * | 11/2006 | Kang et al. | .................... | 327/276 |
| 7,233,629 B2 * | 6/2007 | Auranen | ........................ | 375/316 |
| 2003/0206603 A1 * | 11/2003 | Husted | ........................... | 375/324 |
| 2004/0013217 A1 * | 1/2004 | Dietrich et al. | ............... | 375/372 |
| 2005/0069055 A1 * | 3/2005 | Song et al. | ..................... | 375/324 |
| 2005/0069059 A1 * | 3/2005 | Krivokapic | .................... | 375/340 |
| 2006/0056546 A1 * | 3/2006 | Hayase et al. | ................ | 375/332 |
| 2007/0268075 A1 * | 11/2007 | Conta et al. | .................... | 331/12 |
| 2007/0291883 A1 * | 12/2007 | Welz et al. | .................... | 375/350 |

OTHER PUBLICATIONS

Mikhael, et al., "Adaptive IQ mismatch cancellation for quadrature IF receivers", 2005.
Yong-Hsiang Hsieh, et al., "ISSCC 2005/Session 5/WLAN Transceivers/5.1.", Nov. 2005.
Behzad Razavi, "IEEE Transactions on Circuits and Systems—II Analog and Digital Signal Processing," vol. 44, No. 6, Jun. 1997, pp. 428-435.

* cited by examiner

*Primary Examiner* — Shuwang Liu
*Assistant Examiner* — Gina McKie
(74) *Attorney, Agent, or Firm* — McClure, Qualey & Rodack, LLP

(57) ABSTRACT

An apparatus and a method for calibrating IQ mismatch to ensure that an in-phase oscillating signal and a quadrature-phase oscillating signal are orthogonal to each other. The apparatus includes a mixer for mixing the in-phase oscillating signal with the quadrature-phase oscillating signal to generate an output signal, a control module for determining a control signal according to a low-frequency component of the output signal, and a phase adjusting module for adjusting the phase of a specific oscillating signal to ensure that the in-phase oscillating signal and the quadrature-phase oscillating signal are orthogonal to each other. The specific oscillating signal may be the in-phase or the quadrature-phase oscillating signal. The apparatus does not require a digital signal-processing unit to perform complex calculations nor requires additional oscillating sources for calibration. Hence, the circuit design is much simplified, and the consumption of system resources is significantly reduced.

14 Claims, 3 Drawing Sheets

APPARATUS AND METHOD FOR CALIBRATING IQ MISMATCH

BACKGROUND OF THE INVENTION

1. Field of the Invention

The present invention relates to an apparatus and a method for calibrating phase difference, and more particularly, to an apparatus and a method for calibrating IQ mismatch.

2. Description of the Prior Art

Please refer to FIG. 1. FIG. 1 illustrates a diagram of a conventional direct down-conversion receiver 10. The direct down-conversion receiver 10 includes an antenna 11, a low noise amplifier (LNA) 12, mixers 14, 24, low pass filters (LPF) 16, 26, analog to digital converters (ADC) 18, 28, and a digital signal processor (DSP) 19. The antenna 11 receives a radio communication signal, and the LNA 12 is utilized for amplifying said radio communication signal received by the antenna 11. The mixer 14 mixes the radio communication signal with a first carrier wave ($COS\omega_c t$ as shown in FIG. 1) to generate an analog signal Sa1, whereas the other mixer 24 mixes the radio communication signal with a second carrier wave ($SIN(\omega_c t+\delta)$ as shown in FIG. 1) to generate an analog signal Sa2. The LPFs 16, 26 filter out high frequency components of the analog signals Sa1, Sa2 respectively. Furthermore, the ADCs 18, 28 respectively convert the analog signals Sa1, Sa2 into corresponding digital signals Sd1, Sd2. Lastly, the DSP 19 is utilized for succeeding signal processing on the digital signals Sd1, Sd2.

As known by those skilled in the art, a 90-degree (i.e. orthogonal) phase difference is required between the first carrier wave and the second carrier wave so that the mixed analog signals Sa1, Sa2 are orthogonal to each other, where the analog signal Sa1 is an in-phase signal and the analog signal Sa2 a quadrature-phase signal. However, in a practical circuit, factors such as temperature, manufacturing process, supply voltage drift, etc., cause an ideal orthogonal phase difference, which indicates 90-degree, to have a phase deviation $\delta$ between the first carrier wave and the second carrier wave. This phenomenon is known as IQ mismatch. As shown in FIG. 1, a phase deviation $\delta$ exists between the first carrier wave $COS\omega_c t$ and the second carrier wave $SIN (\omega_c t+\delta)$. The IQ mismatch affects signal demodulation so that a bit error rate of a communication system is raised. Therefore, the above-mentioned phase deviation $\delta$ has to be calibrated for further correcting the analog signals Sa1, Sa2 so as to increase the bit rate of the communication system.

There are two methods of calibrating the IQ mismatch of the conventional direct down-conversion receiver. In a first conventional method, after an in-phase analog signal and a quadrature-phase analog signal are converted into a corresponding in-phase digital signal and a corresponding quadrature-phase digital signal by the analog-to-digital converters 18 and 28 respectively, a phase deviation $\delta$ between said two digital signals are measured in the digital domain. Afterwards, an adjustment signal is outputted according to the measured phase difference, and a phase compensation is performed on both the in-phase analog signal and the quadrature-phase analog signal in the analog domain for compensating IQ mismatch between said analog signals. In a second conventional method, a phase deviation $\delta$ between the in-phase digital signal and the quadrature-phase digital signal are also measured in the digital domain. A difference between the first and the second conventional methods is, after measuring said phase deviation in the second conventional methods, a phase compensation is immediately performed on both the in-phase digital signal and the quadrature-phase digital signal in the digital domain. In both the above-mentioned conventional methods, the phase deviation between the digital signals Sd1, Sd2 is measured in the digital domain by performing a Discrete Fourier Transform (DFT) on the digital signals Sd1, Sd2 with a digital circuit of the DSP 19 for determining the phase deviation $\delta$. Afterwards, a conventional Gram-Schmidt orthogonalization method is utilized to perform a phase compensation in the analog domain. A least-mean-square (LMS) algorithm implemented with a digital circuit may otherwise be utilized to perform a phase-compensation in the digital domain. For a detailed explanation of the abovementioned phase compensations, please refer to "Adaptive IQ Mismatch Cancellation for Quadrature IF Receiver," Isis Mikhael, Wasfy B. Mikhael, David Chestr, and Brent Myers, IEEE Midwest Symposium on Circuits and Systems, August 2002. However, utilizing the DFT to calculate the phase deviation $\delta$ not only requires a complex logic circuit to perform inextricable logic calculations, but also raises power consumption. Furthermore, a digital circuit requires external calibrating signals to perform the LMS algorithm for the phase compensation, and which complicates related circuit design and raises related power consumption.

SUMMARY OF THE INVENTION

Therefore the claimed invention provides a direct down-conversion structured receiver and method for calibrating IQ mismatch without an external oscillating source and yet a phase difference between an in-phase oscillating signal and a quadrature-phase oscillating signal can be detected, and then a phase compensation is performed on the in-phase oscillating signal or the quadrature-phase oscillating signal to solve the above-mentioned problem.

The claimed invention discloses an apparatus for calibrating IQ mismatch so that an in-phase oscillating signal and a quadrature-phase oscillating signal are orthogonal to each other, the apparatus comprises: a mixer for mixing the in-phase oscillating signal and the quadrature-phase oscillating signal to generate an output signal, a control module for determining a control signal according to a low-frequency component of the output signal; and a phase adjusting module for adjusting the phase of at least one of the in-phase oscillating signal and the quadrature-phase oscillating signal according to the control signal so that the in-phase oscillating signal and the quadrature-phase oscillating signal are orthogonal to each other.

The claimed invention discloses a method for calibrating IQ mismatch so that an in-phase oscillating signal and a quadrature-phase oscillating signal are orthogonal to each other, the method comprises: mixing the in-phase oscillating signal and the quadrature-phase oscillating signal to generate an output signal, generating a control signal according to a low frequency component of the output signal, and adjusting the phase of at least one of the in-phase oscillating signal and the quadrature-phase oscillating signal according to the control signal so that the in-phase oscillating signal and the quadrature-phase oscillating signal are orthogonal to each other according to the control signal.

The claimed invention discloses an apparatus for calibrating IQ mismatch so that an in-phase oscillating signal and a quadrature-phase oscillating signal are orthogonal to each other, the apparatus comprises: a phase detection module for detecting the in-phase oscillating signal and the quadrature-phase oscillating signal to generate a low frequency signal, an calculating unit for generating a control signal according to the low frequency signal, wherein the calculating unit raises or reduces the control signal according to the magnitude of the low frequency signal, and a phase adjusting module coupled to the calculating unit for adjusting the phase of at least one of the in-phase oscillating signal and the quadrature-phase oscillating signal according the control signal so that the in-phase oscillating signal and the quadrature-phase oscillating signal are orthogonal to each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
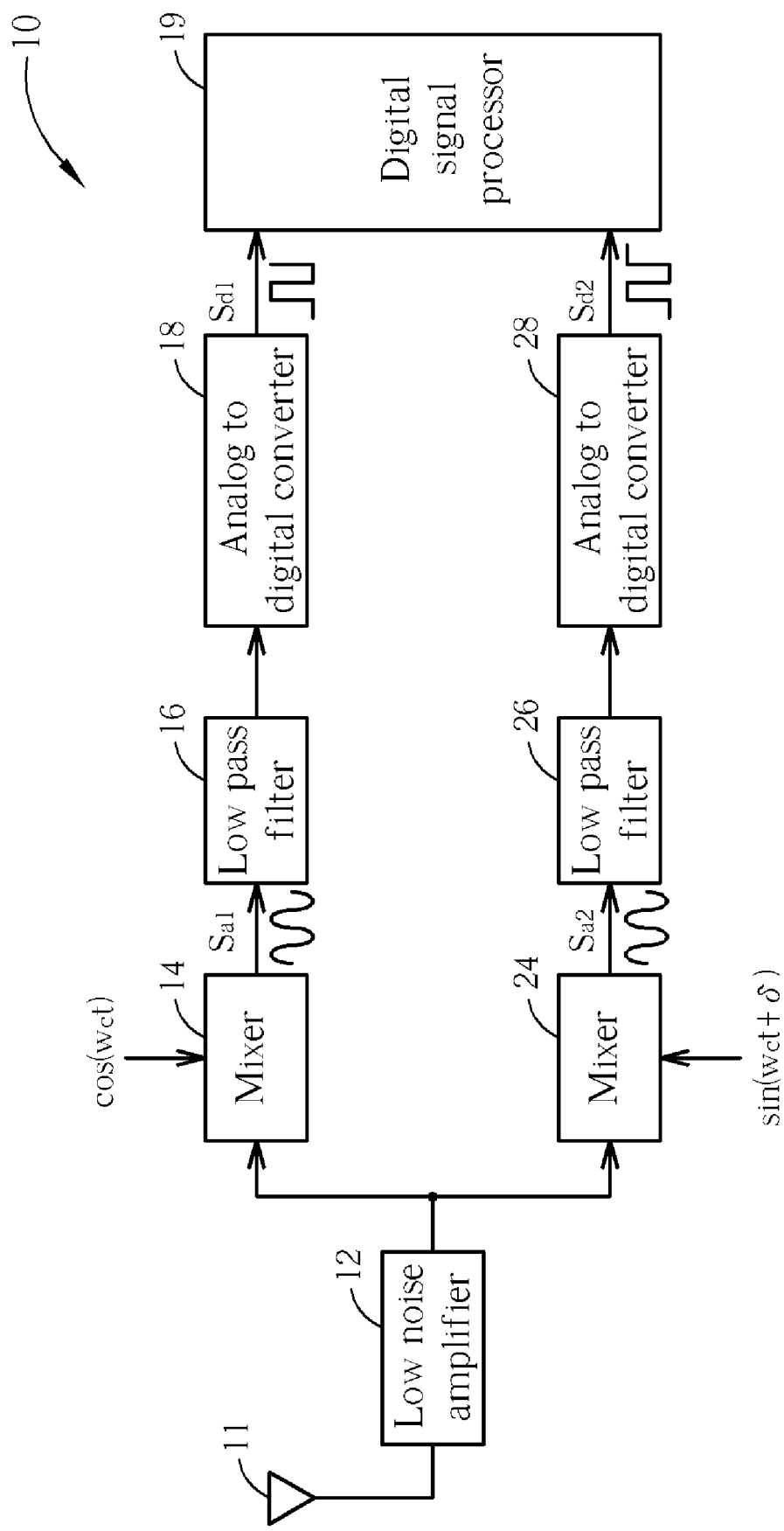
FIG. 1 illustrates a diagram of a conventional direct down-conversion structured receiver.
Figure 2:
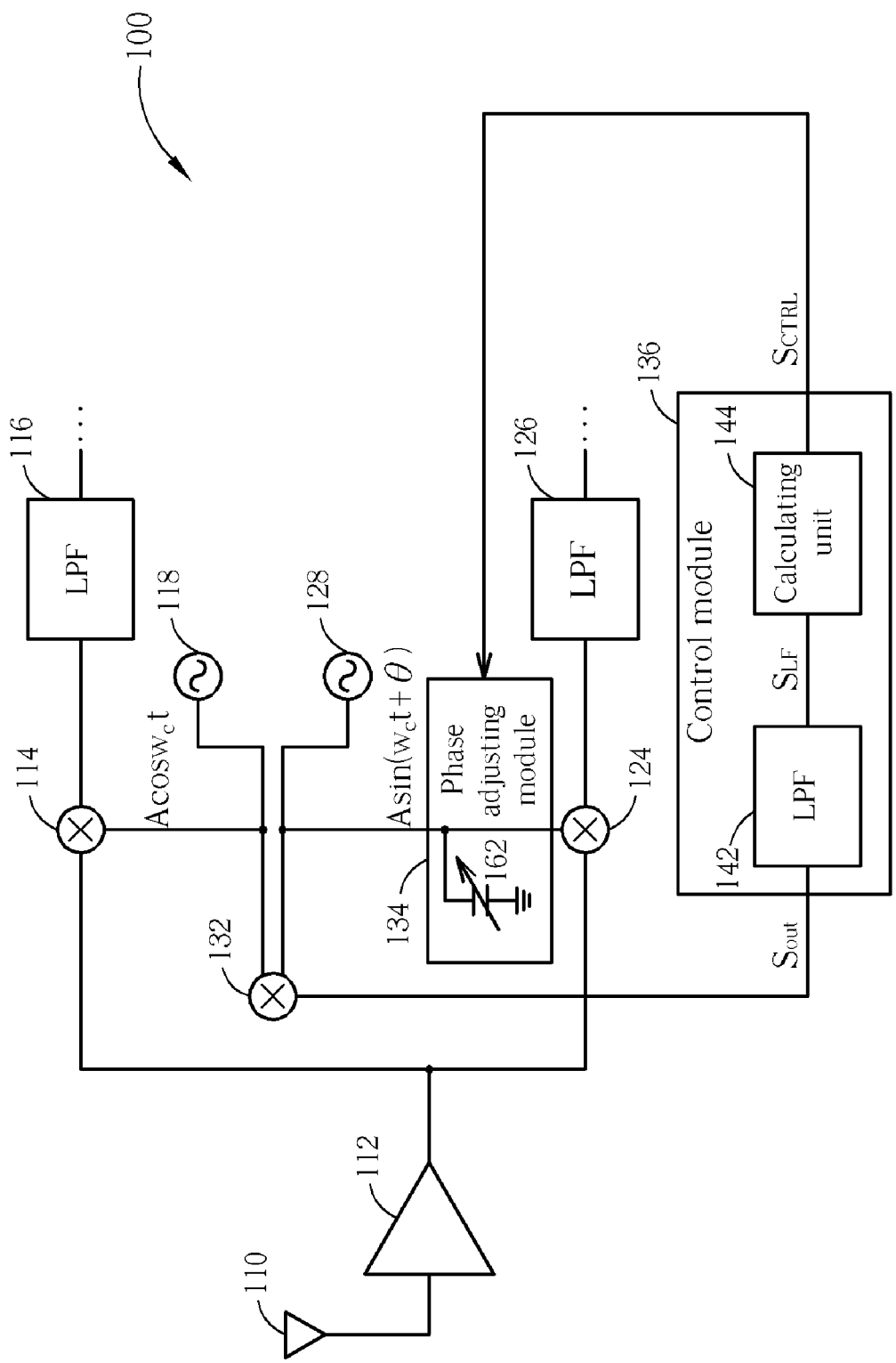
FIG. 2 illustrates a diagram of an apparatus for calibrating IQ mismatch according to a preferred embodiment of the present invention.

Please refer to FIG. 2. FIG. 2 illustrates a diagram of an apparatus 100 for calibrating IQ mismatch according to a preferred embodiment of the present invention. In this embodiment, the apparatus 100 is applied in a direct down-conversion transceiver. The apparatus 100 includes: an antenna 110, a low noise amplifier 112, a plurality of mixers 114, 124, 132, a plurality of low pass filters 116, 126, an in-phase oscillating source 128, a phase adjusting module 134 and a control module 136. As shown in FIG. 1, the structures and operations of the antenna 110, the low noise amplifier 112, the mixers 114, 124 and the plurality of low pass filters 116, 126 are similar to the components in FIG. 1. Additionally, as they are well known those skilled in the art, further details will not be reiterated. An in-phase oscillating source 118 and a quadrature-phase oscillating source 128 are utilized to generate an in-phase oscillating signal A $\cos(w_c t)$ and a quadrature-phase oscillating signal A $\sin(w_c t+\theta)$ respectively, however, the method is not limited to the above-mentioned parameters. For example, the present invention may utilize a single oscillating source and split an oscillating signal outputted by the oscillating source into an in-phase oscillating signal and a quadrature-phase oscillating signal, which is generated by providing an orthogonal delay with a phase delayer.

In this embodiment, the mixer 132 directly mixes the in-phase oscillating signal A $\cos(w_c t)$ and the quadrature-phase oscillating signal A $\sin(w_c t+\theta)$ to generate an output signal Sout, the operation of the mixer 132 is represented by the formula below:

$$A\cos(w_c t) \cdot A\sin(w_c t + \theta) = \frac{A^2}{2}[\cos\theta \cdot \sin 2w_c t + \sin\theta \cdot \cos 2w_c t] + \frac{A^2}{2} \cdot \sin\theta \quad \text{Formula (1)}$$

Note that, to ensure a first delay time for the in-phase oscillating signal traveling from the in-phase oscillating source 118 to the mixer 132 equal to a second delay time for the quadrature-phase oscillating signal traveling from the quadrature-phase oscillating source 128 to the mixer 132, both the route lengths from the mixer 132 to the in-phase oscillating source 118 and to the quadrature-phase oscillating source 128 are required to be equal. Therefore, the mixer 132 of the present invention lies at a geometric center line of the layout pattern of the in-phase oscillating source 118 and the quadrature-phase oscillating source 128, but the scope of the present invention is not limited to this embodiment. As shown in FIG. 2, a low pass filter 142 and a calculating unit 144 are disposed within the control module 136. The low pass filter 142 filters a low frequency component of the output signal Sout to generate a low frequency signal SLF. When θ is negligible, it indicates that $$S_{LF} = \frac{A^2}{2} \cdot \sin\theta \approx \frac{A^2}{2} \cdot \theta.$$

In other words, the mixer 132 and the low pass filter 142 may be viewed as a phase detection module for outputting the low frequency signal SLF. A higher low frequency signal SLF indicates a greater IQ mismatch (i.e., the θ value) between the in-phase oscillating signal and the quadrature-phase oscillating signal; a lower low frequency signal SLF indicates a smaller IQ mismatch (i.e., the θ value) between the in-phase oscillating signal and the quadrature-phase oscillating signal. The calculating unit 144 then generates a control signal SCTRL according to the low frequency signal SLF. The phase adjusting module 134 adjusts the phase of the quadrature-phase oscillating signal A $\sin(w_c t+\theta)$ according to the control signal SCTRL so that the in-phase oscillating signal and the quadrature-phase oscillating signal are roughly orthogonal to each other. Note that the phase adjusting module 134 of the present invention includes a variable capacitor 162, and related operations of the phase adjusting module 134 will be further described in a succeeding paragraph. Furthermore, connections of the phase adjusting module 134 are not limited by the abovementioned embodiment of the present invention. For example, the phase adjusting module 134 may also be coupled to the in-phase oscillating source 118 for adjusting the phase of the in-phase oscillating signal A $\cos(w_c t)$ to calibrate the IQ mismatch.

Figure 3:
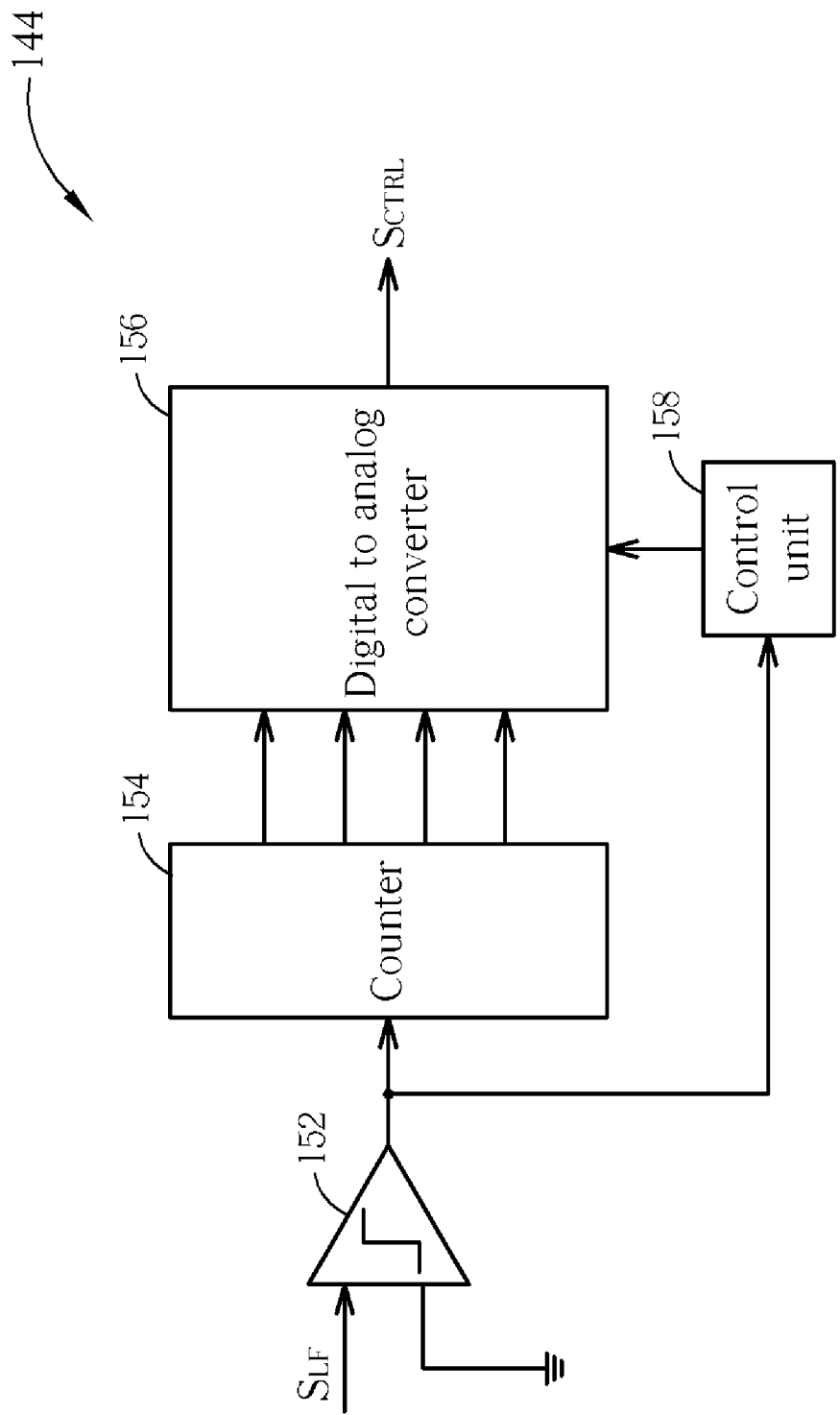
FIG. 3 illustrates a diagram of the calculating unit of FIG. 2 according to a preferred embodiment of the present invention.

Please refer to FIG. 3. FIG. 3 illustrates a diagram of the calculating unit 144 of FIG. 2 according to an embodiment of the present invention. As shown in FIG. 3, the calculating unit 144 includes: a comparator 152, a counter 154, a digital-to-analog converter 156 and a control unit 158. The comparator 152 compares a ground voltage with the voltage of the low frequency signal SLF to determine positive or negative the voltage of the low frequency signal SLF is. When the voltage value of the low frequency signal SLF is positive, a value indicated by output bits of the counter 154 increases by 1. When the voltage value of the low frequency signal SLF is negative, the value indicated by the output bits of the counter 154 decreases by 1. For example, assume the counter 154 outputs four bits with an initial binary value '1000'. When the low frequency signal SLF is positive during a first input clock cycle of the counter 154, the counter 154 outputs an increased-by-1 binary value '1001'; when the low frequency signal SLF is positive during a second input clock cycle of the counter 154, the counter 154 outputs an increased-by-1 binary value '1010'; and when the low frequency signal SLF becomes negative during a third input clock cycle of the counter 154, the counter 154 outputs a decreased-by-1 binary value '1001', and so forth.

The digital-to-analog converter 156 will generate a control signal $S_{CTRL}$ according to the binary value outputted by the counter 154. For example, when the counter 154 outputs '1000', the voltage of the control signal SCTRL is 1.5V; when the counter 154 outputs '1001', the voltage of the control signal SCTRL becomes 1.6V; when the counter 154 outputs '0111', the voltage of the control signal SCTRL is 1.4V, and so forth. Lastly, the phase adjusting module 134 adjusts the phase of the quadrature-phase oscillating signal $A\sin(w_c t+\theta)$ according to the control signal SCTRL. Please refer to FIG. 2 again. The phase adjusting module 134 of the embodiment includes a variable capacitor 162 connected to the ground, and the capacitance of the variable capacitor 162 is changed according to the control signal SCTRL. Therefore, the quadrature-phase oscillating source 128 changes the phase of the outputted quadrature-phase oscillating signal according to the changed capacitance of the variable capacitor 162. Note that the phase adjusting module 134 of the present invention is not limited to the abovementioned embodiment. That is, in the present invention, the phase adjusting module 134 may also be implemented with other elements capable of adjusting phases of the in-phase oscillating signal or the quadrature-phase oscillating signal according to the control signal SLF.

In this embodiment, the control unit 158 is utilized for controlling the digital-to-analog converter 156 to generate the control signal SCTRL. After the voltage of the low frequency signal SLF travels back and forth between positive and negative in a number of times, the control unit 158 determines that the in-phase oscillating signal and the quadrature-phase oscillating signal are approximately orthogonal at this time. Thus, the control unit 158 orders the digital-to-analog converter 156 to maintain the voltage of the control signal SCTRL. Therefore, the capacitance of the variable capacitor 162 remains unchanged hereafter.

In comparison to the prior art, the apparatus for calibrating IQ mismatch of the present invention utilizes a mixer for directly mixing the in-phase oscillating signal and the quadrature-phase oscillating signal to estimate a phase difference between the in-phase oscillating signal and the quadrature-phase oscillating signal according to the mixing result for further adjustment of the phases of the in-phase oscillating signal and the quadrature-phase oscillating signal in an analog domain. Therefore, the apparatus of the present invention does not require a digital signal-processing unit to perform complex calculations nor requires additional oscillating sources for calibration. Hence, the circuit structure illustrated in the present invention is far simplified than the prior art, and the consumption of system resources is also significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for calibrating IQ mismatch so that an in-phase oscillating signal and a quadrature-phase oscillating signal are orthogonal to each other, the calibration apparatus comprising:
    a phase detection module for detecting the in-phase oscillating signal and the quadrature-phase oscillating signal to generate a low frequency signal indicating a phase difference between the in-phase oscillating signal and the quadrature-phase oscillating signal in an analog domain;
    a calculating unit for generating a control signal in the analog domain according to the low frequency signal, wherein if a magnitude of the low frequency signal is within a first range, the calculating unit raises a voltage level of the control signal, if the magnitude of the low frequency signal is within a second range, the calculating unit reduces the voltage level of the control signal, and the first range and the second range do not overlap, and wherein if a number of consecutive times that the magnitude of the low frequency signal travels back and forth between the first range and the second range exceeds a predetermined value, the calculating unit stops changing the control signal; and
    a phase adjusting module coupled to the calculating unit for adjusting the phase of at least one of the in-phase oscillating signal or the quadrature-phase oscillating signal according to the control signal so that the in-phase oscillating signal and the quadrature-phase oscillating signal are orthogonal to each other while maintaining respective frequencies of the in-phase oscillating signal and the quadrature-phase oscillating signal in the analog domain.

2. The calibration apparatus of claim 1 wherein the phase detection unit comprises:
    a mixer for mixing the in-phase oscillating signal and the quadrature-phase oscillating signal to generate a mixed signal; and
    a low pass filter for generating the low frequency signal according to the mixed signal, wherein the low frequency signal is a low frequency component of the mixed signal.

3. The calibration apparatus of claim 2 wherein the in-phase oscillating signal and the quadrature-phase oscillating signal are generated from an in-phase oscillating source and a quadrature-phase oscillating source respectively, and the mixer lies at a geometric center line of the layout pattern of the in-phase oscillating source and the quadrature-phase oscillating source.

4. The calibration apparatus of claim 1 wherein the magnitude of the low frequency signal corresponds to an IQ mismatch degree of the in-phase oscillating signal and the quadrature-phase oscillating signal.

5. The calibration apparatus of claim 1, wherein the in-phase oscillating signal is further mixed with a radio communication signal to generate a first analog signal, and the quadrature-phase oscillating signal is further mixed with the radio communication signal to generate a second analog signal.

6. An apparatus for calibrating IQ mismatch so that an in-phase oscillating signal and a quadrature-phase oscillating signal are orthogonal to each other, the apparatus comprising:
    a mixer for mixing the in-phase oscillating signal and the quadrature-phase oscillating signal to generate an output signal indicating a phase difference between the in-phase oscillating signal and the quadrature-phase oscillating signal in an analog domain;
    a low pass filter for generating a low frequency signal according to the output signal;
    a calculating unit for generating a control signal according to the low frequency signal, wherein if a magnitude of the low frequency signal is within a first range, the calculating unit raises a voltage level of the control signal, if the magnitude of the low frequency signal is within a second range, the calculating unit reduces the voltage level of the control signal, and the first range and the second range do not overlap, and wherein if a number of consecutive times that the magnitude of the low frequency signal travels back and forth between the first range and the second range exceeds a predetermined value, the calculating unit stops changing the control signal; and a phase adjusting module for adjusting a phase of at least one of the in-phase oscillating signal or the quadrature-phase oscillating signal according to the control signal so that the in-phase oscillating signal and the quadrature-phase oscillating signal are orthogonal to each other while maintaining respective frequencies of the in-phase oscillating signal and the quadrature-phase oscillating signal in the analog domain.

7. The apparatus of claim 6 wherein the phase adjusting module is a variable capacitor, and a capacitance of the variable capacitor changes according to the control signal.

8. The apparatus of claim 6 wherein the in-phase oscillating signal and the quadrature-phase oscillating signal are generated by an in-phase oscillating source and a quadrature-phase oscillating source respectively, and the mixer lies at a geometric center line of the layout pattern of the in-phase oscillating source and the quadrature-phase oscillating source.

9. The apparatus of claim 6 wherein the in-phase oscillating signal and the quadrature-phase oscillating signal are generated by an oscillating source and a phase delayer.

10. The apparatus of claim 6 is applied in a direct conversion transceiver.

11. The apparatus of claim 6, wherein the in-phase oscillating signal is further mixed with a radio communication signal to generate a first analog signal, and the quadrature-phase oscillating signal is further mixed with the radio communication signal to generate a second analog signal.

12. A method for calibrating IQ mismatch so that an in-phase oscillating signal and a quadrature-phase oscillating signal are orthogonal to each other, the method comprising:
    mixing the in-phase oscillating signal and the quadrature-phase oscillating signal to generate an output signal indicating a phase difference between the in-phase oscillating signal and the quadrature-phase oscillating signal in an analog domain;
    filtering out a low frequency signal of the output signal;
    generating a control signal according to the low frequency signal, wherein if a magnitude of the low frequency signal is within a first range, a voltage level of the control signal raises, if the magnitude of the low frequency signal is within a second range, the voltage level of the control signal reduces, and the first range and the second range do not overlap, and wherein if a number of consecutive times the magnitude of the low frequency signal travels back and forth between the first range and the second range exceeds a predetermined value, the calculating unit stops changing the control signal; and
    adjusting a phase of at least one of the in-phase oscillating signal or the quadrature-phase oscillating signal according to the control signal so that the in-phase oscillating signal and the quadrature-phase oscillating signal are orthogonal to each other while maintaining respective frequencies of the in-phase oscillating signal and the quadrature-phase oscillating signal in the analog domain.

13. The method of claim 12 further comprising the step of:
    providing a variable capacitor for adjusting the phase of at least one of the in-phase oscillating signal and the quadrature-phase oscillating signal according to a capacitance of the variable capacitor changed by the control signal.

14. The method of claim 12, wherein the in-phase oscillating signal is further mixed with a radio communication signal to generate a first analog signal, and the quadrature-phase oscillating signal is further mixed with the radio communication signal to generate a second analog signal.

* * * * *